(12) United States Patent
Nakata

(10) Patent No.: US 6,635,563 B2
(45) Date of Patent: Oct. 21, 2003

(54) METHOD OF MANUFACTURING SEMICONDUCTOR DEVICE

(75) Inventor: Yoji Nakata, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/956,051

(22) Filed: Sep. 20, 2001

(65) Prior Publication Data
US 2002/0098674 A1 Jul. 25, 2002

(30) Foreign Application Priority Data
Jan. 22, 2001 (JP) .................................. 2001-013035

(51) Int. Cl.[7] .......................................... H01L 21/4763
(52) U.S. Cl. ...................................... 438/636; 438/637
(58) Field of Search ............................. 430/5, 311–330; 438/584, 635–640

(56) References Cited

U.S. PATENT DOCUMENTS 6,187,484 B1 * 2/2001 Glass et al. .................. 430/5
6,242,160 B1 * 6/2001 Fukuzawa et al. .......... 430/313

FOREIGN PATENT DOCUMENTS

| JP | 7-240466 | 9/1995 |
| JP | 7-263542 | 10/1995 |

* cited by examiner

*Primary Examiner*—Matthew Smith
*Assistant Examiner*—Calvin Lee
(74) *Attorney, Agent, or Firm*—McDermott, Will & Emery

(57) ABSTRACT

Precisely forming a fine resist pattern on a stopper film of silicon nitride, in a method of manufacturing a multi-layer interconnection structure which uses the stopper film. A silicon nitride film forming step is a step to select a thickness of a silicon nitride film to thereby reduce reflection light of an excimer laser which impinges upon a photoresist layer on the silicon nitride film from the back surface of the photoresist layer.

6 Claims, 3 Drawing Sheets

METHOD OF MANUFACTURING SEMICONDUCTOR DEVICE

BACKGROUND OF THE INVENTION

The present invention relates to a method of manufacturing a semiconductor device with a multi-layer interconnection structure.

FIG. 3 shows a conventional method of manufacturing a semiconductor device with multi-layer interconnection structure described in JP, 7-240466, A. In this method, first, as shown in FIG. 3A, a lower wiring layer 12 is formed on a semiconductor substrate 11. Following this, an inter-layer insulation layer 13 of SiO2 or the like and a stopper film 14 of SiN are successively stacked. The inter-layer insulation layer 13 and the stopper film 14 are thereafter etched using a resist mask (not shown), thereby forming an aperture portion 15. A plug layer 16 of tungsten or the like is formed so as to fill up the aperture portion 15.

Following this, as shown in FIG. 3B, the plug layer 16 is etched back using the stopper film 14 as an etching stopper. The plug layer 16 is over-etched so as to completely remove the plug layer 16 on the stopper film 14. Therefore, the top surface of the plug layer 16 becomes slightly lower than the surface of the stopper film.

Next, as shown in FIG. 3C, the stopper film 14 is removed using phosphoric acid. In consequence, the top surface of the plug layer 16 projects above the surface of the inter-layer insulation layer 13.

At last, as shown in FIG. 3D, an upper wiring layer 17 is formed. The steps described above complete a semiconductor device with a multi-layer interconnection structure 200 in which the plug layer 16 connects the lower wiring layer 12 with the upper wiring layer 17.

During these steps, since the top surface of the plug layer 16 projects above the surface of the inter-layer insulation layer 13 as shown in FIG. 3C, the connection between the plug layer 16 and the upper wiring layer 17 becomes perfect.

However, as an aperture size of the aperture portions 15 becomes small in semiconductor devices because of increasing progress of integration, the size and shape of the aperture portions 15 become various. Consequently the connection, etc., between the plug layer 16 and the upper wiring layer 17 becomes imperfect.

Research on a cause of this identified that during exposure of a resist layer (not shown) formed on the stopper film 14, exposure light reflected by the surfaces of the stopper film 14 and the inter-layer insulation layer 13 once again impinges upon and sensitizes the resist layer, and therefore, it is impossible to precisely form a fine resist pattern. The reflection of the exposure light, in particular, was found to be remarkable in the case of exposure light with a short wavelength such as an excimer laser.

SUMMARY OF THE INVENTION

Noting this, the present invention aims at providing a method to manufacture a multi-layer interconnection structure which uses a stopper film, with which it is possible to precisely form a fine resist pattern on the stopper film.

The present invention is directed to a manufacturing method for a semiconductor device with a multi-layer interconnection structure, comprising: a step to prepare a semiconductor substrate; a step to form an inter-layer insulation layer on said semiconductor substrate; a silicon nitride film forming step to form a silicon nitride film on said inter-layer insulation layer; a step to form a photoresist layer on said silicon nitride film and exposing said photoresist with an excimer laser to thereby form a resist mask; an etching step to etch at least said silicon nitride film using said resist mask as an etching mask to thereby form an aperture portion; a step to deposit a conductive layer within said aperture portion and on said silicon nitride film; a step to etch back said conductive layer on said silicon nitride film using said silicon nitride film as a stopper so that the conductive layer remaining within said aperture portion becomes a plug layer; a step to remove the silicon nitride film so that a top end of the plug layer protrudes above the surface of the inter-layer insulation layer; and a step to form a wiring layer connected with said plug layer on said inter-layer insulation layer, wherein said silicon nitride film forming step is a step to select the film thickness of said silicon nitride film in such a manner that reflection light of said excimer laser which impinges upon said photoresist layer from the back surface of the photoresist layer decreases.

With the reflection light decreased in this manner, it is possible to accurately and precisely form a resist mask with a fine opening pattern. As a result, it is possible to form highly-integrated multi-layer interconnection structures with an excellent reproducibility and at a high yield.

The silicon nitride film forming step described above is preferably a step to select the film thickness of said silicon nitride film in such a manner that a reflectance ratio of the reflection light of the excimer laser relative to incident light is 0.3 or lower.

Since the reflectance ratio is 0.3 or lower, it is possible to precisely form a finer resist pattern.

The silicon nitride film forming step described above is preferably a step to select the film thickness of said silicon nitride film from the range of about 1200 Å to about 1340 Å and the range of about 1730 Å to about 1880 Å.

As the silicon nitride film has such a film thickness, it is possible to ensure that the reflectance ratio of the excimer laser is 0.3 or smaller.

The silicon nitride film forming step described above is preferably a step to select the film thickness of the silicon nitride film from the range of about 1230 Å to about 1310 Å and the range of about 1760 Å to about 1850 Å.

As the silicon nitride film has such a thickness, it is possible to ensure that the reflectance ratio of the excimer laser is 0.2 or lower.

The silicon nitride film forming step is preferably a step to select either about 1270 Å or about 1800 Å for the film thickness of said silicon nitride film.

As the silicon nitride film has such a film thickness, it is possible to minimize the reflectance ratio of the excimer laser.

A wavelength of the excimer layer described above is about 248 nm. The thickness of the silicon nitride film described above is effective in reducing the reflectance ratio of the excimer laser with this wavelength.

The etching step described above preferably comprises a step to etch the silicon nitride film using the resist mask described above, and after removing said resist mask, further to etch the inter-layer insulation layer mentioned above using said silicon nitride film as a mask.

Etching the inter-layer insulation layer using the silicon nitride film as a mask, it is possible to prevent the mask from receding during the etching, and hence, to precisely form an aperture portion with a high aspect ratio.

A step may be exercised which requires to form other wiring layer on the semiconductor substrate so that the plug layer mentioned above is connected to said other wiring layer.

As clearly described above, using the manufacturing method according to the present invention, it is possible to form a fine resist pattern at a step which uses a stopper film of silicon nitride. As a result, it is possible to precisely form a highly-integrated multi-layer interconnection structure.

DETAILED DESCRIPTION OF THE PREFERRED EMBODIMENTS

Figure 1A:
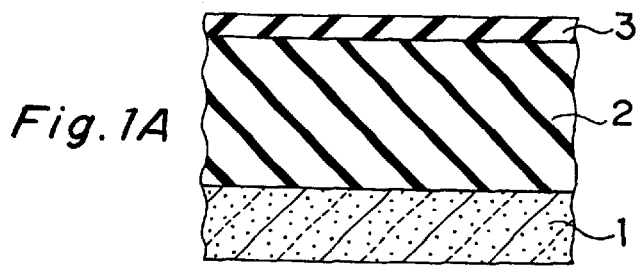
FIGS. 1A–1G show the manufacturing steps for the multi-layer interconnection structure according to the present invention.

FIGS. 1A–1G show steps to manufacture a multi-layer interconnection structure generally denoted as 100 according to a preferred embodiment of the present invention. Among manufacturing steps, first, as shown in FIG. 1A, an inter-layer insulation layer 2 of SiO2 or the like with a film thickness of about 2000 Å is formed on a semiconductor substrate 1 of silicon or the like. Following this, a stopper film 3 of SiN is formed. The thickness of the stopper film 3 is selected from the range of about 1200 Å to about 1340 Å or the range of about 1730 Å to about 1880 Å. More preferable thickness is about 1270 Å or about 1800 Å.

Figure 2:
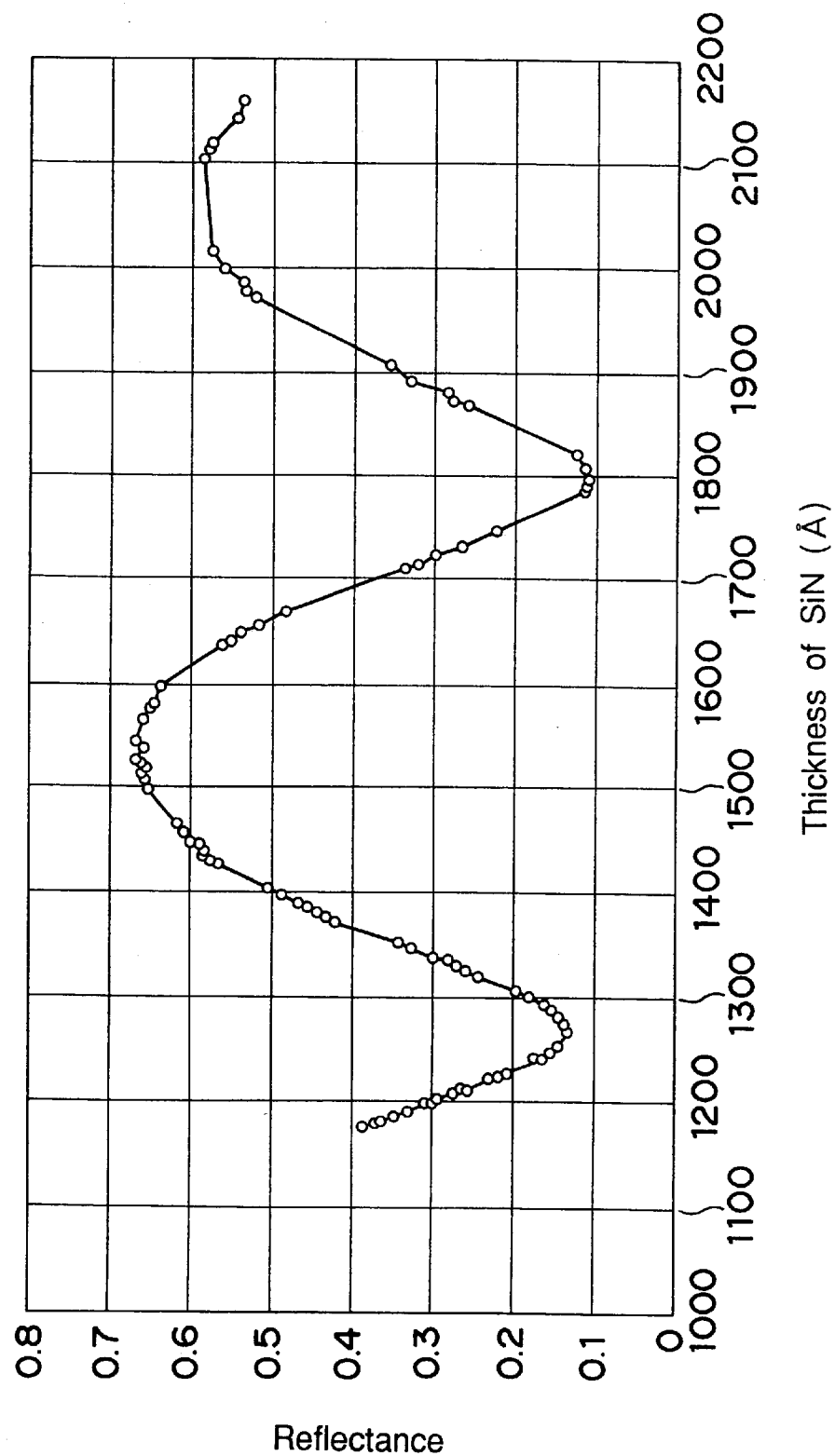
FIG. 2 is a graph showing a relationship between a thickness of and a reflectance of an SiN film.

FIG. 2 is a graph showing a relationship between a film thickness and a reflectance of an SiN film. The graph was obtained by measuring a reflectance of an excimer laser (intensity of reflection light/intensity of incident light) in the condition that the excimer with a wavelength of about 248 nm was impinged upon an SiN film formed on an $SiO_2$ layer.

As the graph clearly shows, when the thickness of the SiN film is predetermined, it is possible to reduce the reflectance of the excimer laser.

Figure 1B:
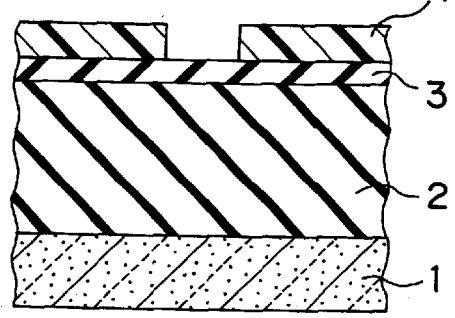

Next, as shown in FIG. 1B, a photoresist layer (not shown) is formed on the stopper film 3. And the photoresist layer is exposed using an excimer laser with a wavelength of about 248 nm, and a resist mask 4 is accordingly formed.

At the exposure step, since the thickness of the stopper film 3 under the photoresist layer is a predetermined film thickness as described above, it is possible to suppress a reflectance of the exposure light to 0.3 or lower, and more preferably, 0.2 or lower. As a result, the resist mask 4 with a fine opening pattern is formed highly accurately and precisely. It is possible to particularly avoid creation of a dimple formed when interference between the incident light and the reflection light partially exposes the photoresist layer.

Figure 1C:
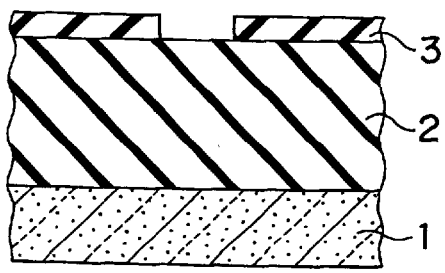

Next, as shown in FIG. 1C, after the stopper film 3 is patterned using the resist mask 4, the resist mask 4 is removed.

Figure 1D:
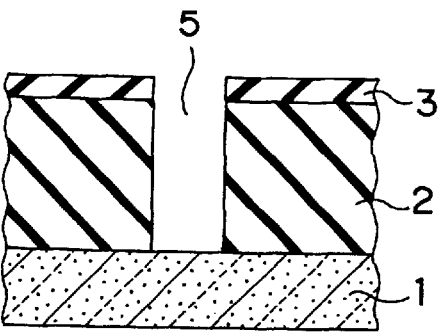

Then, as shown in FIG. 1D, the inter-layer insulation layer 2 is etched using the stopper film 3 as a mask, thereby forming an aperture portion 5. The surface of the semiconductor substrate 1 is exposed in the bottom surface of the aperture portion 5.

In this preferred embodiment, since the inter-layer insulation layer 2 is etched using the stopper film 3 as a mask, the mask barely recedes, and the aperture portion 5 with a high aspect ratio is formed precisely. Alternatively, both the stopper film 3 and the inter-layer insulation layer 2 may be etched using the resist mask 4 as customarily practiced.

Figure 1E:
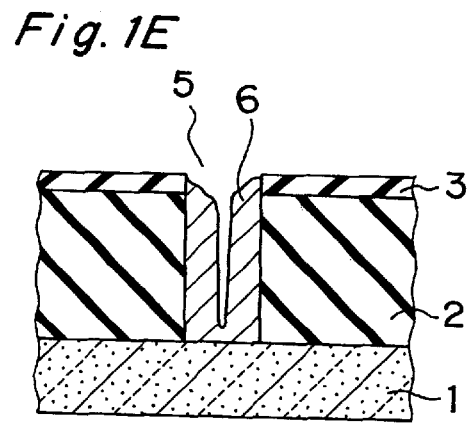

Next, as shown in FIG. 1E, a conductive layer (not shown) of tungsten, for example, is formed in the aperture portion 5 and on the stopper film 3 so as to fill up the aperture portion 5. Following this, the conductive layer is etched back from the top surface using the stopper film 3 as an etching stopper. This leaves the conductive layer only inside the aperture portion 5, and the conductive layer becomes a plug layer 6. The conductive layer is etched back somewhat excessively so that the conductive layer will not remain on the stopper film 3. Therefore, the top end of the plug layer 6 is slightly lower than the surface of the stopper film 3.

Figure 1F:
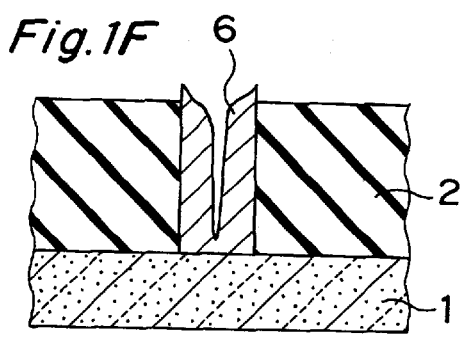

Then, as shown in FIG. 1F, the stopper film 3 is removed by etching. In consequence, the top end of the plug layer 6 protrudes above the surface of the inter-layer insulation layer 2.

Figure 1G:
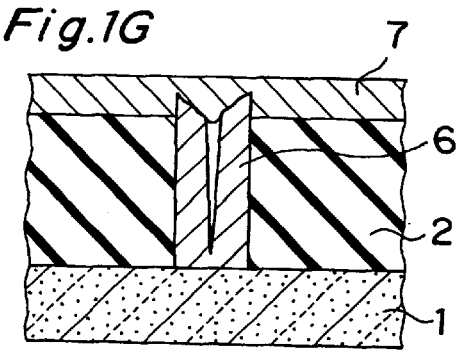

At last, as shown in FIG. 1G, a wiring layer 7 of copper, aluminum or the like is formed on the inter-layer insulation layer 2 and the plug layer 6. In this preferred embodiment, since the top end of the plug layer 6 protrudes above the surface of the inter-layer insulation layer 2, when the wiring layer 7 is formed, the wiring layer 7 and the plug layer 6 are connected sufficiently with each other.

Through these steps, the multi-layer interconnection structure generally denoted as 100 is completed.

Although the plug layer 6 does not completely fill up the aperture portion 5 but leaves a hollow portion as shown in FIG. 1G, since the aspect ratio of the aperture portion 5 is large in the multi-layer interconnection structure 100, it is needless to mention that the aperture portion 5 may be completely filled up with the plug layer 6.

Figure 3A:
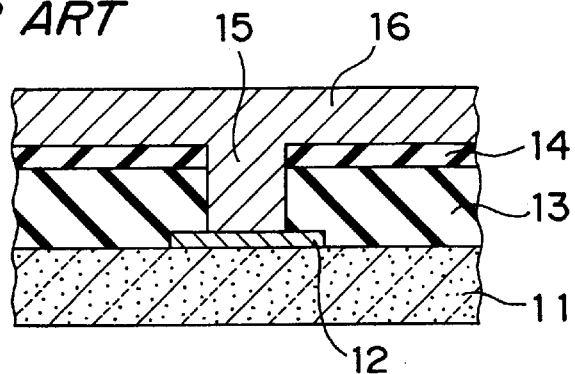
FIGS. 3A–3D show the manufacturing steps for a conventional multi-layer interconnection structure.
Figure 3B:
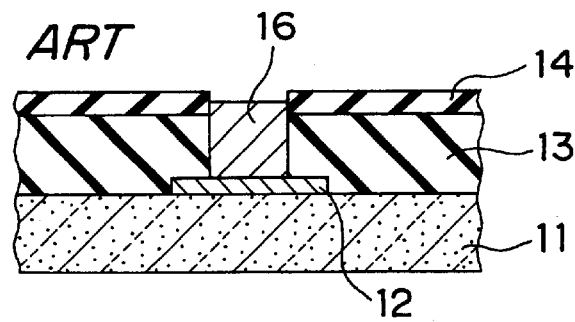
Figure 3C:
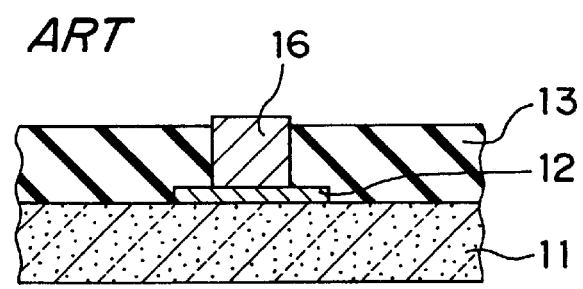
Figure 3D:
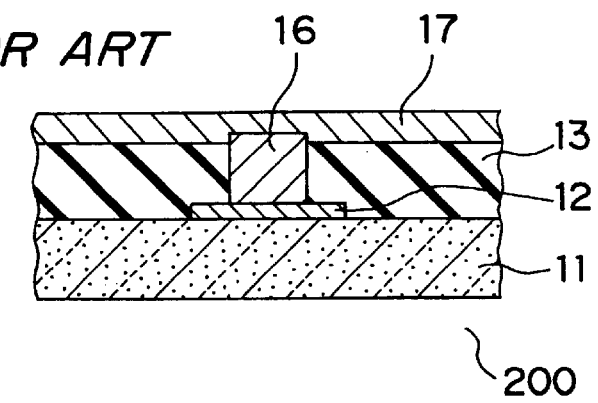

Further, while the multi-layer interconnection structure 100 is a structure in which the plug layer 6 connects the semiconductor substrate 1 with the wiring layer 7, the multi-layer interconnection structure 100 may be a structure as that shown in FIG. 3D, for instance, in which the plug layer 6 connects the wiring layer 7 with other wiring layer which is formed on the semiconductor substrate 1.

What is claimed is:

1. A method of manufacturing a semiconductor device with a multi-layer interconnection structure, comprising:

a step to prepare a semiconductor substrate;

a step to form an inter-layer insulating layer on said semiconductor substrate;

a silicon nitride film forming step to form a silicon nitride film on said inter-layer insulation layer;

a step to form a photoresist layer on said silicon nitride film and to expose said photoresist with an excimer laser to thereby form a resist mask;

an etching step to etch at least said silicon nitride film using said resist mask as an etching mask to thereby form an aperture portion;

a step to deposit a conductive layer within said aperture portion and on said silicon nitride film;

a step to etch back said conductive layer on said silicon nitride film using said silicon nitride film as a stopper so that said conductive layer remaining within said aperture portion becomes a plug layer;

a step to remove said silicon nitride film so that a top end of said plug layer protrudes above the surface of said inter-layer insulation layer; and a step to form a wiring layer connected with said plug layer on said inter-layer insulation layer, wherein said silicon nitride film forming step is a step to select a thickness of said silicon nitride film from the range of about 1200Å to about 1340Å and the range of about 1730Å to about 1880Å to thereby reduce the reflectance of the reflection light of said excimer laser which impinges upon said photoresist layer from the back surface of said photoresist layer relative to incident light 0.3 or smaller.

2. The method according to claim 1, wherein said silicon nitride film forming step is a step to select the film thickness of said silicon nitride film from the range of about 1230 Å to about 1310 Å and the range of about 1760 Å to about 1850 Å.

3. The method according to claim 1, wherein said silicon nitride film forming step is a step to select either about 1270 Å or about 1800 Å for the film thickness of said silicon nitride film.

4. The method of claim 1, wherein a wavelength of said excimer laser is about 248 nm.

5. The method according to claim 1, wherein said etching step comprises a step to etch said silicon nitride film using said resist mask, and further a step to etch said inter-layer insulation layer after removing said resist mask, using said silicon nitride film as a mask.

6. The method according to claim 1, further comprising a step to form other wiring layer on said semiconductor substrate so that said plug layer is connected to said other wiring layer.

* * * * *